United States Patent [19]

Kawakami et al.

[11] Patent Number: 5,028,743
[45] Date of Patent: Jul. 2, 1991

[54] PRINTED CIRCUIT BOARD WITH FILLED THROUGHHOLES

[75] Inventors: Shin Kawakami; Satoshi Haruyama; Hirotaka Okonogi, all of Saitama, Japan

[73] Assignee: Nippon CMK Corp., Japan

[21] Appl. No.: 470,842

[22] Filed: Jan. 26, 1990

[30] Foreign Application Priority Data

Jan. 27, 1989 [JP] Japan ................................. 1-18330

[51] Int. Cl.$^5$ .............................................. H05K 9/00
[52] U.S. Cl. .................................... 174/264; 174/265; 174/35 R
[58] Field of Search ....................... 174/265, 264, 35 R

[56] References Cited

U.S. PATENT DOCUMENTS

| | | | |
|---|---|---|---|
| 4,383,363 | 5/1983 | Hayakawa et al. | 174/264 |
| 4,649,461 | 3/1987 | Matsuta | 174/35 R |
| 4,791,248 | 12/1988 | Oldenettel | 174/265 |

OTHER PUBLICATIONS

McDermott, C. J. *Face Protection of Printed Circuit Boards*, IBM Technical Disclosure Bulletin; vol. 11, No. 7, Dec. 1968.

*Primary Examiner*—Leo P. Picard
*Assistant Examiner*—Trinidad Korka
*Attorney, Agent, or Firm*—Bruce L. Adams; Van C. Wilks

[57] ABSTRACT

A double sided or multi-layered printed circuit board comprises an insulating substrate having conductors on opposed major surfaces thereof which are electrically connected together via a through-hole. A sealing member composed of conductive resin fills the through-hole. An insulating layer covers the conductors and sealing member, and an electronic wave-shielding layer covers the insulating layer.

10 Claims, 1 Drawing Sheet

PRINTED CIRCUIT BOARD WITH FILLED THROUGHHOLES

BACKGROUND OF THE INVENTION

1. Field of the Invention

The present invention relates to a printed circuit board, and more particularly to a double-sided or multi-layered printed circuit board.

2. Related Art Statement

Conventionally, a method of providing an electromagnetic wave-shielding layer on a printed circuit board via an insulating layer is disclosed in Japanese Patent Laid-Open No. 213192/1987 and is publicly known. As shown in FIG. 3, electromagnetic wave-shielding layers 5 are respectively provided on printed circuits 2 formed on both surfaces of an insulating board 1, via insulating layers 4, and solder resist layers 6 are also provided thereon, thereby forming a printed circuit board 9.

It should be noted that the electromagnetic wave-shielding layers 5 in the printed circuit board 9 are formed in portions excluding plated through-hole portions 7 for conductance by through-holes 8, or part-connecting lands or the like (not shown).

However, in the printed circuit board 9 provided with the conventional electromagnetic wave-shielding layers 5, since part of the electromagnetic wave-shielding layers 5 portions 7, there have been cases where the circuit is affected by electromagnetic waves which can cause passive cr active noise through the conductive through-hole portions 7. In addition, since the continuity of the electromagnetic wave-shielding layer 5 is disrupted by the provision of the conducting through-holes 7, there are cases where it is impossible to obtain a satisfactory effect since the effective area of the electronic wave-shielding layers 5 is reduced.

SUMMARY OF THE INVENTION

Accordingly, an object of the present invention is to provide a printed circuit board which exhibits excellent electromagnetic wave-shielding effect, thereby overcoming the above-described drawbacks of the conventional art.

To this end, according to the present invention, there is provided a double-sided or multi-layered printed circuit board comprising on each surface thereof a heat- and weather-resistant sealing member filled in a conducting through-hole portion, and an electronic wave-shielding layer via an insulating layer.

In accordance with the present invention, since the arrangement is such that a heat- and weather-resistant sealing member is filled in the conductive through-hole portion, and an electromagnetic wave-shielding layer is formed via an insulating layer, it is possible to form an electronic wave-shielding layer on the conducting throughhole portion as well.

In addition, since the continuity of the electronic wave-shielding layer is not disrupted by the conducting through-hole portion, it is possible to enlarge the effective area of the electronic wave-shielding layer.

DESCRIPTION OF THE PREFERRED EMBODIMENTS

Referring now to the accompanying drawings, a description will be given of the embodiments of the present invention.

Figure 1:
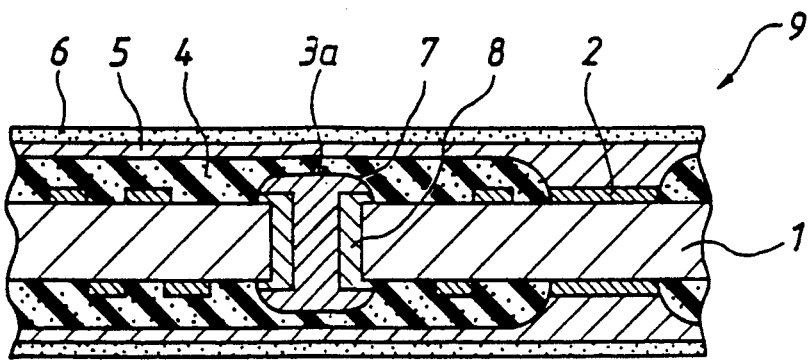
FIG. 1 is an enlarged cross-sectional view illustrating a first embodiment of a printed circuit board in accordance with the present invention.

FIG. 1 is a partially expanded cross-sectional view illustrating a first embodiment of a printed circuit board in accordance with the present invention. Printed circuits 2 formed of required patterns are formed on both surfaces of an insulating board 1 through a plated through-hole 8. A sealing member 3a is filled in a conducting through-hole portion 7 and is formed of a thermosetting-type synthetic resin material, such as epoxy resin, or a photosetting-type synthetic resin material, such as acrylic epoxy resin. This sealing member 3a is formed by filling paste made of such a synthetic resin material in each conducting through-hole portion 7 of the printed circuit board 9 by such means as screen printing or the like, and then by allowing it to set.

In addition, an insulating layer 4 is further formed on the insulating plate 1, and an electronic wave-shielding layer 5 is formed on the upper side of this insulating layer 4. Subsequently, a solder resist layer 6 which also serves as a protective layer for the electronic wave-shielding layer 5 is formed.

Figure 2:
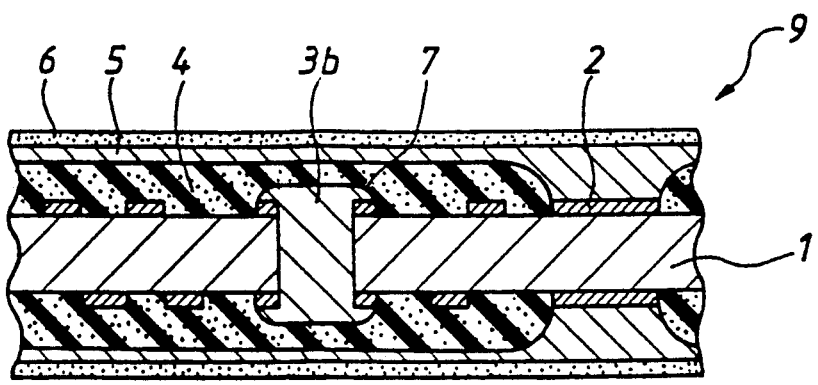
FIG. 2 is an enlarged cross-sectional view illustrating a second embodiment of the printed circuit board in accordance with the present invention.
Figure 3:
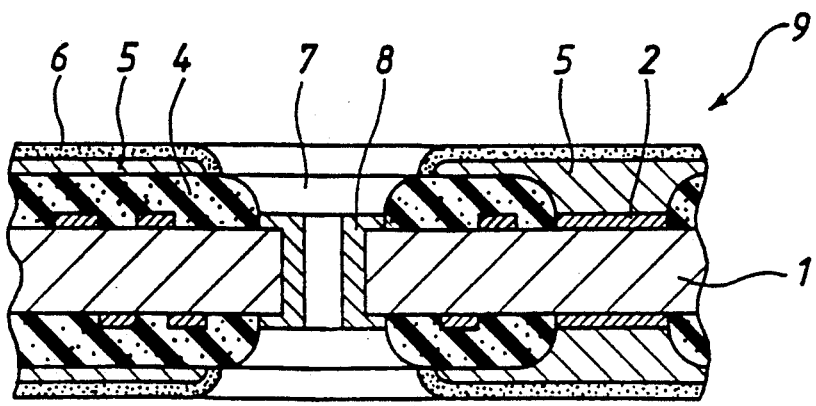
FIG. 3 is an enlarged cross-sectional view of a conventional printed circuit board.

FIG. 2 is a partially enlarged cross-sectional view illustrating a second embodiment of the printed circuit board of the present invention.

In this embodiment, the sealing member for the printed circuit board 9 in the first embodiment is formed of a conductive synthetic material containing carbon, silver, copper or the like. Namely, the two surfaces of the printed circuit board 9 can be made electrically conductive with respect to each other by means of a conductive sealing member 3b, so that it is not absolutely necessary to provide the conducting through-hole portions 7.

It should be noted that the components that are identical with those shown in FIG. 1 are denoted by the same reference numerals, and a description thereof will be omitted.

In addition, conventionally known methods are used with respect to the processes of forming the insulating layers 4, the electronic wave-shielding layers 5, and the solder resist layers 6. Therefore, a description of their specific methods will be omitted. It goes without saying that the methods are not confined to the aforementioned methods and these layers can be formed by various publicly known methods.

In accordance with the present invention, since a heat-and weather-resistant sealing member is filled in a conducting through-hole portion, and an electronic wave-shielding layer is formed via an insulating layer, it is possible to form an electronic wave-shielding layer on the conducting through-hole as well. Therefore, it is possible to prevent the effect of electromagnetic waves, which can produce passive and active noise, at the conducting through-hole portion as well.

Furthermore, since the effective area of the shielding layer can be enlarged without the continuity of the electronic wave-shielding layer being disrupted by the conducting through-hole portion, it is possible to provide a printed circuit board having a very excellent electromagnetic wave-shielding effect.

What is claimed is:

1. A multi-layered printed circuit board comprising an insulating substrate with two surfaces with at least one through-hole, conductors on the substrate, means for providing conduction from one surface of the substrate to the other via the at least one through-hole, a heat and weather-resistant sealing member completely filling that at least one through-hole, an insulating layer over the conductors and the at least one through-hole, and an electronic wave-sheilding layer over the insulating layer.

2. A printed circuit board according to claim 1, wherein said sealing member comprises a thermosetting-type synthetic resin material.

3. A printed circuit board according to claim 1, wherein the means for providing conduction comprises said sealing member composed of a conductive synthetic resin material.

4. A printed circuit board according to claim 1, wherein said sealing member comprises a photosetting-type synthetic resin material.

5. The printed circuit board according to claim 1, wherein the multi-layered printed circuit board comprises a double-sided printed circuit board.

6. A multi-layered printed circuit board comprising: an insulating substrate having two main surfaces with conductors thereon and at least one through-hole for providing electrical connection between conductors on the two main surfaces; a sealing member completely filling the at least one through-hole; an insulating layer covering the conductors and the at least one through-hole on both main surfaces; and an electronic wave-shielding layer covering the insulating layer on both main surfaces.

7. The printed circuit board according to claim 6, wherein said sealing member comprises a photosetting-type synthetic resin material.

8. A printed circuit board according to claim 6, wherein said sealing member comprises a thermosetting-type synthetic resin material.

9. The printed circuit board according to claim 6, wherein the sealing member is composed of a conductive synthetic resin material.

10. The printed circuit board according to claim 6, wherein the multi-layered printed circuit board comprises a double-sided printed circuit board.

* * * * *